United States Patent
Wu et al.

(10) Patent No.: US 8,624,396 B2
(45) Date of Patent: Jan. 7, 2014

(54) APPARATUS AND METHOD FOR LOW CONTACT RESISTANCE CARBON NANOTUBE INTERCONNECT

(75) Inventors: Hsien-Chang Wu, Taichung (TW); Hsiang-Huan Lee, Jhudong Township (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 22 days.

(21) Appl. No.: 13/523,644

(22) Filed: Jun. 14, 2012

(65) Prior Publication Data

US 2013/0334689 A1 Dec. 19, 2013

(51) Int. Cl.
*H01L 23/48* (2006.01)

(52) U.S. Cl.
USPC ............ 257/758; 257/E23.165; 257/E21.585; 438/622; 977/932

(58) Field of Classification Search
USPC ........... 257/758, E23.165, E21.585; 438/622; 977/932
See application file for complete search history.

(56) References Cited

U.S. PATENT DOCUMENTS

| 7,312,531 | B2 * | 12/2007 | Chang et al. ................... 257/770 |
| 7,960,277 | B2 * | 6/2011 | Nihei ............... 438/637 |
| 2004/0214429 | A1 | 10/2004 | Han et al. |
| 2008/0246148 | A1 * | 10/2008 | Won et al. ..................... 257/746 |
| 2009/0269921 | A1 | 10/2009 | Kawabata et al. |
| 2010/0244262 | A1 * | 9/2010 | Awano et al. ................. 257/758 |
| 2011/0233779 | A1 * | 9/2011 | Wada et al. .................... 257/751 |
| 2012/0295078 | A1 * | 11/2012 | Kondo et al. .............. 428/195.1 |
| 2013/0015581 | A1 * | 1/2013 | Wann et al. .................... 257/751 |

FOREIGN PATENT DOCUMENTS

DE   10 2004 049 453 A1   4/2006
EP       1 975 999 A1   10/2008

OTHER PUBLICATIONS

Zhu, L., et al., "Assemblling Carbon Nanotube Bundles Using Transfer Process for Fine-Pitch Electrical Interconnect Applications," Electronic Components and Technology Conference, May 29, 2007-Jun. 1, 2007, pp. 1981-1985.

Portet, C., et al., "Modification of Al current collector surface by sol-gel deposit for carbon-carbon supercapacitor applications," Electrochimica Acta, vol. 49, Issue 6, 2004, pp. 905-912.

Dijon, J., et al., "Ultra-high density Carbon Nontubes on Al-Cu for advanced Vias", International Electron Device Meeting, IEDM, 2010, pp. 33.4.1-33.4.4.

Chai, Y., et al., "Low-Resistance Electrical Contact to Carbon Nanotubes With Graphitic Interfacial Layer," IEEE Tranactions on Electron Devices, vol. 59, No. 1, Jan. 2012, pp. 12-19.

* cited by examiner

*Primary Examiner* — Trung Q Dang

(74) *Attorney, Agent, or Firm* — Slater & Matsil, L.L.P.

(57) ABSTRACT

An apparatus comprises a first dielectric layer formed over a substrate, a first metal line embedded in the first dielectric layer, a second dielectric layer formed over the first dielectric layer, a second metal line embedded in the second dielectric layer, an interconnect structure formed between the first metal line and the second metal line, a first carbon layer formed between the first metal line and the interconnect structure and a second carbon layer formed between the second metal line and the interconnect structure.

20 Claims, 8 Drawing Sheets

APPARATUS AND METHOD FOR LOW CONTACT RESISTANCE CARBON NANOTUBE INTERCONNECT

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for low resistance structures such as interconnects to further improve the thermal performance of electronic devices.

Semiconductor devices may include a variety of semiconductor structures such as transistors, capacitors, resistors and the like formed on a substrate. One or more conductive layers formed of a metal, metal alloy and the like are separated by dielectric layers. There may be a variety of interconnect structures formed between the conductive layers to interconnect the semiconductor structures, provide an electrical connection between a metal layer and its adjacent metal layer.

Carbon nanotubes have been employed to form low resistance interconnect structures. A carbon nanotube is a tube structure formed of carbon atoms. Carbon nanotubes are of a variety of unique properties such as high strength, high thermal conductivity, good electrical conductivity, good electromigration and the like. Carbon nanotubes' electronic properties may vary with the differences in their structures. Carbon nanotubes may be of a metallic property or a semiconducting property depending on their physical parameters such as length, diameter and the like.

By selecting appropriate physical parameters such as diameters, carbon nanotubes can be a good conductive material. In particular, despite that a single carbon nanotube may be of a high resistance, a plurality of carbon nanotubes grown in parallel can achieve a resistance as low as copper. As such, carbon nanotubes can be a good material for interconnect structures because they can support high current densities. However, the interconnect structures formed by carbon nanotubes may be of high resistance due to a high resistance contact between the carbon nanotubes and their corresponding metal lines.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a semiconductor device having a carbon nanotube interconnect and a carbon layer between the carbon nanotube interconnect and its adjacent metal layer. The embodiments of the disclosure may also be applied, however, to a variety of structures of semiconductor devices. Hereinafter, various embodiments will be explained in detail with reference to the accompanying drawings.

Figure 1:
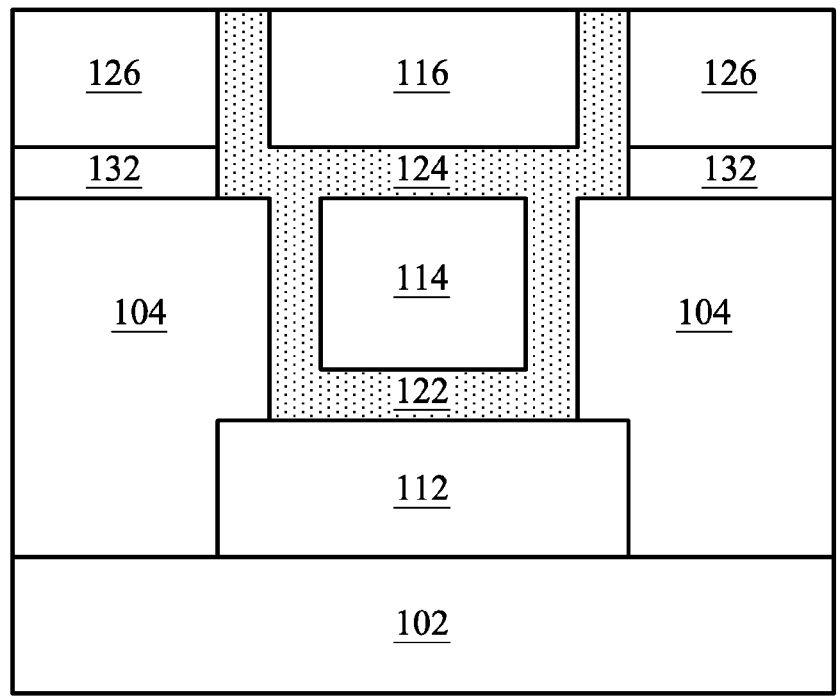
FIG. 1 illustrates a cross sectional view of a semiconductor device in accordance with an embodiment.

FIG. 1 illustrates a cross sectional view of a semiconductor device in accordance with an embodiment. The semiconductor device includes a substrate 102. A first metal line 112 is formed over the substrate 102. A second metal line 116 is formed over the first metal line 112. As shown in FIG. 1, there may be a carbon nanotube interconnect structure 114 formed between the first metal line 112 and the second metal line 116. In addition, there may be a first carbon layer 122 formed between the bottom of the interconnect structure 114 and the first metal line 112. Likewise, there may be a second carbon layer 124 formed between the top surface of the interconnect structure 114 and the second metal line 116. FIG. 1 further illustrates the interconnect structure 114 is surrounded by a carbon ring and the second metal line 116 is partially surrounded by a carbon layer.

As shown in FIG. 1, a first dielectric layer 104 is formed over the substrate 102. The first metal line 112 and the interconnect structure 114 are embedded in the first dielectric layer 104. A cap layer 132 is deposited over the first dielectric layer 104. A second dielectric layer 126 is formed over the cap layer 132. The second metal line 116 is embedded in the second dielectric layer 126.

The substrate 102 may be formed of suitable semiconductor materials such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, with other crystal orientations, may also be used. Additionally, the substrate 102 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 102 may be doped with a p-type dopant, such as boron, aluminum, gallium, or the like, although the substrate may alternatively be doped with an n-type dopant, as is known in the art.

The first metal line 112 and the second metal line 116 may be made through any suitable formation process (e.g., lithography with etching, damascene, dual damascene, or the like) and may be formed using suitable conductive materials such as copper, aluminum, aluminum alloys, copper alloys or the like.

In accordance with an embodiment, the first metal line 112 may be formed through a damascene process, whereby masks are deposited onto the surface of the first dielectric layer 104, holes are etched into the surface, and conductive material (such as tungsten or copper) is used to fill the holes. It should be noted that the first metal line 112 may comprise one or more layers of conductive material. For example, the first metal line 112 may include barrier layers, adhesive layers, multiple conductive layers, or the like. The formation of the second metal line 116 is similar to that of the first metal line 112, and hence is not discussed in detail to avoid repetition.

In accordance with an embodiment, the first dielectric layer 104 and the second dielectric layer 126 have a low dielectric constant (k value), preferably lower than about 3.0. More preferably, the first dielectric layer 104 and the second dielectric layer 126 may have a k value of less than about 2.5, and hence is sometimes referred to as an extra low-k (ELK) dielectric layer. The first dielectric layer 104 and the second dielectric layer 126 may include commonly used materials such as carbon-containing dielectric materials, and may further contain nitrogen, hydrogen, oxygen, and combinations thereof. A porous structure may be used for lowering the k value.

A cap layer 132 is formed on top of the first dielectric layer 104. The cap layer 132 is nitrogen free, and comprises materials such as carbon and oxygen. The cap layer 132 is also used as a bottom anti-reflective coating (BARC), which is used for patterning the subsequently formed metal hard mask. Therefore, the cap layer 132 is alternatively referred to as nitrogen-free anti-reflective coating (NFARC). The formation methods of the cap layer 132 include chemical vapor deposition (CVD) and physical vapor deposition (PVD). However, other methods such as atomic layer deposition (ALD) may also be used.

A hard mask (not shown) may be formed on top of the cap layer 132. The hard mask maybe formed of metallic materials, such as Ti, TiN, Ta, TaN, Al, and the like, although in a non-metal hard mask scheme, non-metallic materials such as $SiO_2$, SiC, SiN and SiON may be used.

Figure 2:
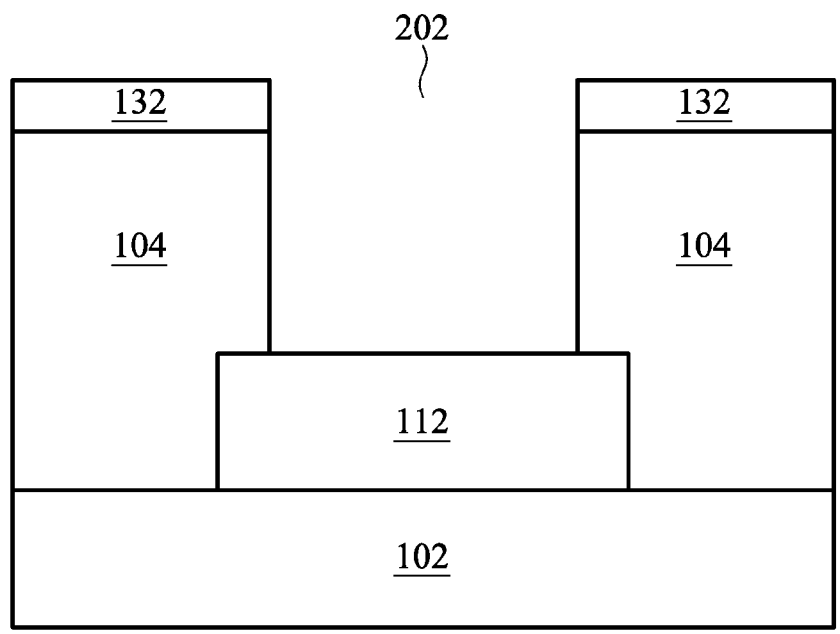
FIG. 2 illustrates a cross sectional view of a semiconductor device prior to the formation of a carbon layer in accordance with an embodiment.

FIGS. 2-8 illustrate intermediate steps of fabricating the interconnect structure 114 shown in FIG. 1 in accordance with an embodiment. FIG. 2 illustrates a cross sectional view of a semiconductor device prior to the formation of a carbon layer in accordance with an embodiment. As shown in FIG. 1, a first metal line 112 is formed over a substrate 102. A first dielectric layer 104 is formed over the substrate 102. There may be an opening 202 on top of the first metal line 112 in the first dielectric layer 104. The opening 202 may be a trench for forming an interconnect structure.

In accordance with an embodiment, the first dielectric layer 104 may be formed of low-k dielectric materials. In order to protect the low-k dielectric materials from chemical mechanical polish (CMP), a cap layer 132 is formed over the dielectric layer 104. The cap layer 132 may be formed of nitrogen-free anti-reflective coating (NFARC) materials. The cap layer 132 may be formed using suitable fabrication processes such as CVD, PVD, ALD and the like. In order to further protect the dielectric layer 104, a hard mask (not shown) may be formed on top of the cap layer 132. The hard mask may be formed of metal materials such as Ti, TiN, Ta, TaN, Al and the like. Alternatively, the hard mask may be formed of non-metal materials such as $SiO_2$, SiC, SiN, SiON and the like.

Figure 3:
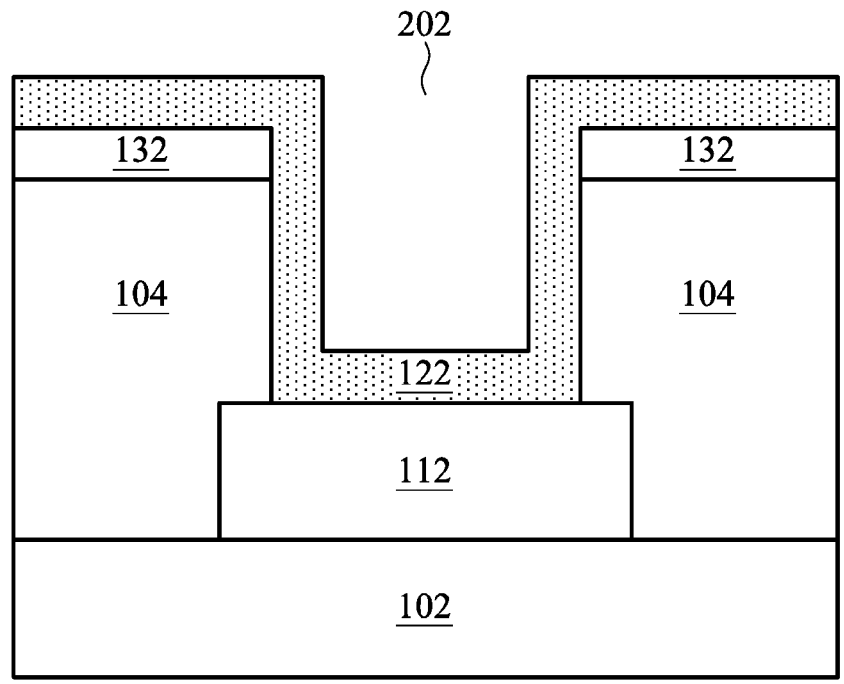
FIG. 3 illustrates a cross sectional view of the semiconductor device shown in FIG. 2 after a carbon layer is deposited using a chemical vapor deposition (CVD) process in accordance with an embodiment.

FIG. 3 illustrates a cross sectional view of the semiconductor device shown in FIG. 2 after a carbon layer is deposited using a CVD process in accordance with an embodiment. The carbon layer 122 is deposited on top of the first metal line 112, the sidewalls of the opening 202 and the top surface of the cap layer 132. In accordance with an embodiment, the carbon layer 122 may be deposited using suitable fabrication techniques such as CVD, plasma enhanced CVD (PECVD) or the like.

In accordance with an embodiment, when a CVD process is employed, the hydrocarbon gas such as $CH_4$, $C_2H_4$, $C_2H_2$ or the like is crystallized to form the carbon layer 122. The carbon layer 122 is of a thickness in a range from about 1 nanometer to about 10 nanometers. One advantageous feature of employing a CVD process to form the carbon layer 122 is that the CVD process is capable of forming the carbon layer 122 in a narrow opening such as a narrow via connected between two conductive layers.

It should be noted while FIG. 3 illustrates the bottom portion of the carbon layer 122 is a single carbon layer coated on the metal surface of the first metal line 112, the carbon content of the bottom portion of the carbon layer 122 may react with the metal of the first metal line 112. As a result, the bottom portion of the carbon layer 112 may be an alloy comprising both carbon and metal.

One advantageous feature of having the carbon layer 122 is that the carbon layer 122 functions as a glue layer between the first metal layer 112 and the carbon nanotubes formed on top of the carbon layer 122. As a result, the adhesion between the carbon nanotubes and the metal lines (e.g., the first metal line 112) is improved. Furthermore, as the adhesion has been improved, the interface resistance between the carbon nanotubes (not shown but illustrated in FIG. 1) and the metal line 112 is reduced.

Figure 4:
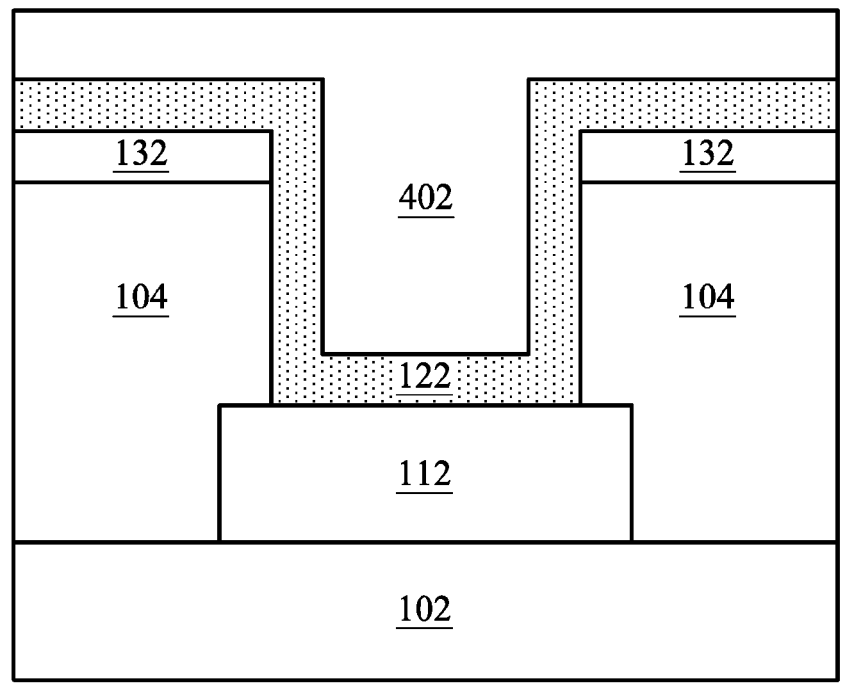
FIG. 4 illustrates a cross sectional view of the semiconductor device after a catalytic CVD process is applied to the opening of the semiconductor device shown in FIG. 3 in accordance with an embodiment.

FIG. 4 illustrates a cross sectional view of the semiconductor device after a catalytic CVD process is applied to the opening of the semiconductor device shown in FIG. 3 in accordance with an embodiment. According to the fabrication processes of the catalytic CVD process, a plurality of catalytic pads may be formed in the opening (not shown but illustrated in FIG. 3) prior to a carbon nanotube growth process. The catalytic pads may be formed of catalytic metals such as alumina ($Al_2O_3$) comprising Fe, Ni and Co. The catalytic pads may be deposited on the surface of the bottom layer using suitable techniques such as the lift-off technique.

According to the fabrication procedures of the lift-off technique, a photoresist layer (not shown) is formed on the bottom layer. After a patterning process, a plurality of openings may be formed in consideration with the predetermined locations of carbon nanotubes. Catalytic metals are deposited into the openings. After a wash process, the photoresist layer is removed. The portion of the catalytic metals over the surface of the photoresist layer is lifted off and washed away with the photoresist layer. As a result, a plurality of catalytic pads (not shown) may be formed.

The nanotubes 402 may be grown by a CVD process. In accordance with an embodiment, the semiconductor device shown in FIG. 4 may be placed in a tube furnace containing mixing gas such as hydrocarbon gas/$ArH_2$. As the temperature of the tube furnace rises to a high level such as around 400 degrees to about around 600 degrees, the methane gas may break up and the carbon atoms may crystallize onto the catalytic pads, thereby forming carbon nanotubes 402.

Figure 5:
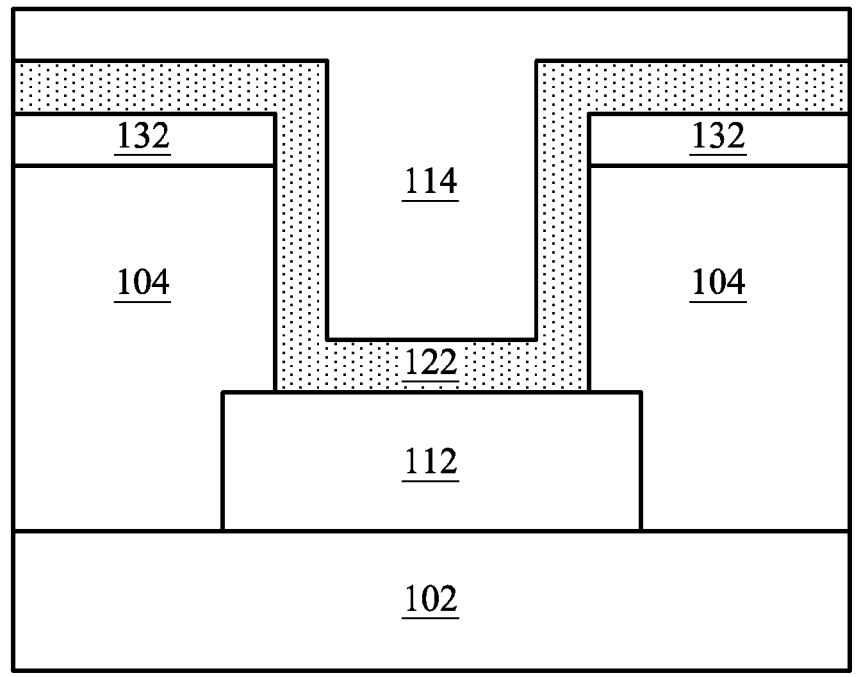
FIG. 5 illustrates a cross sectional view of an interconnect structure after another CVD process is applied to the semiconductor device shown in FIG. 4 in accordance with an embodiment.

FIG. 5 illustrates a cross sectional view of the semiconductor device after another CVD process is applied to the interconnect structure shown in FIG. 4 in accordance with an embodiment. The free space between adjacent carbon nanotubes 402 shown in FIG. 4 may be filled with SiO2 using suitable fabrication techniques such as tetraethyl orthosilicate (TEOS) fabricated via CVD, PECVD and the like. As a result, a plurality of carbon nanotubes 114 may be embedded in SiO2 as shown in FIG. 5.

Figure 6:
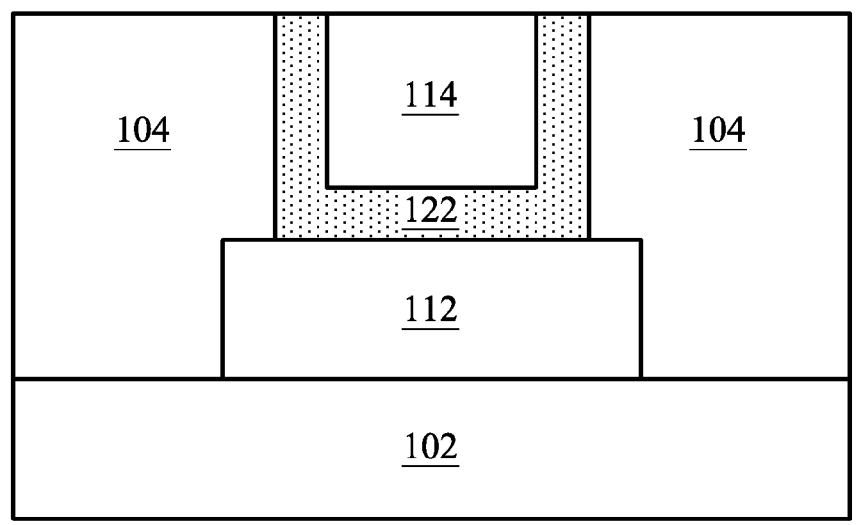
FIG. 6 illustrates a cross sectional view of the semiconductor device after a chemical mechanical polish (CMP) process is applied to the interconnect structure shown in FIG. 5 in accordance with an embodiment.

FIG. 6 illustrates a cross sectional view of the semiconductor device after a CMP process is applied to the interconnect structure shown in FIG. 5 in accordance with an embodiment. A CMP process is performed to remove excess portions of the carbon nanotubes 114 shown in FIG. 5, and the remaining portions are the carbon nanotube interconnection structure.

Figure 7:
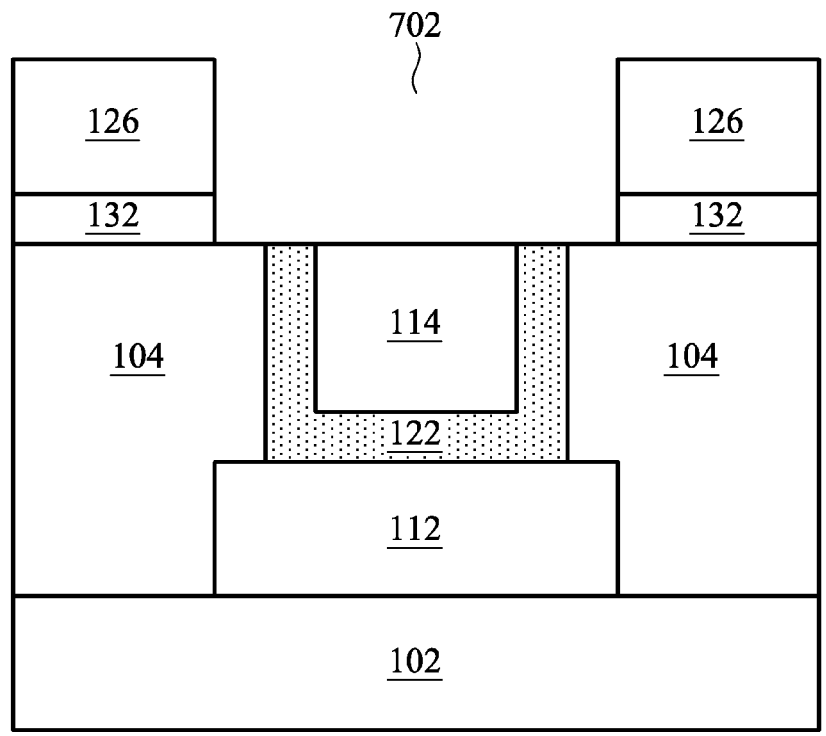
FIG. 7 illustrates a cross sectional view of the semiconductor device after a patterning process is applied to the interconnect structure shown in FIG. 6 in accordance with an embodiment.

FIG. 7 illustrates a cross sectional view of the semiconductor device after a patterning process is applied to the interconnect structure shown in FIG. 6 in accordance with an embodiment. A cap layer 132 is formed on top of the first low-k dielectric layer 104. A second dielectric layer 126 is formed over the cap layer 132. In accordance with an embodiment, the second dielectric layer 126 may comprise low-k dielectric materials. Once the cap layer 132 and the second dielectric layer 126 have been formed, the second dielectric layer 126 may be patterned.

In accordance with an embodiment, the second dielectric layer 126 may be patterned using, e.g., a photolithographic masking and etching process, whereby a photolithographic mask (not shown in FIG. 7) is formed over the second dielectric layer and then exposed to a patterned light. After exposure, desired portions of the photolithographic mask are removed to expose the underlying dielectric layer, which may then be etched to remove the exposed portions, thereby patterning the second dielectric layer 126 to form the opening 702 shown in FIG. 7.

Figure 8:
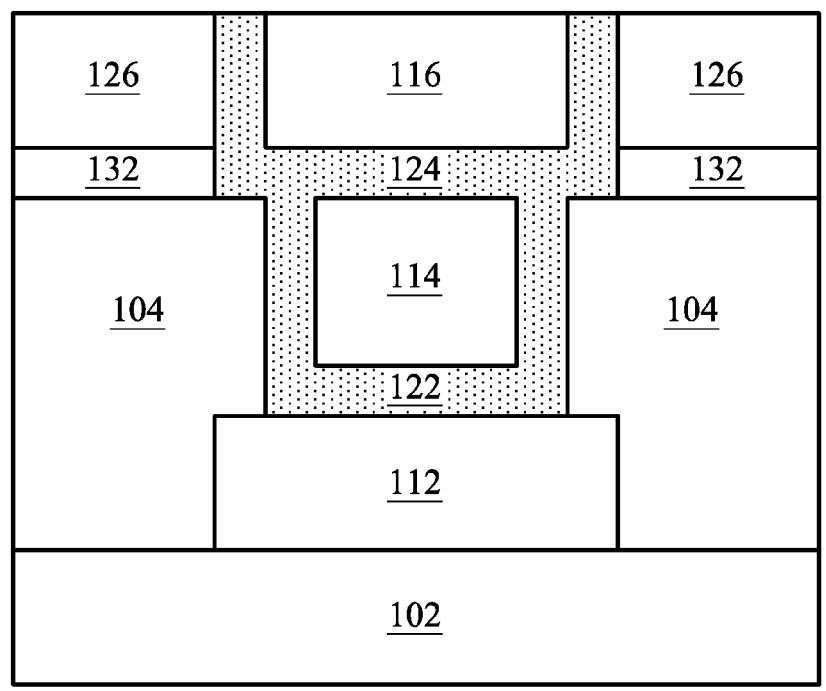
FIG. 8 illustrates a cross sectional view of the semiconductor device after a carbon deposition process and a metallization process are applied to the interconnect structure shown in FIG. 7 in accordance with an embodiment.

FIG. 8 illustrates a cross sectional view of the semiconductor device after a carbon deposition process and a metallization process are applied to the interconnect structure shown in FIG. 7 in accordance with an embodiment. The carbon deposition process is similar to the carbon deposition process described above with respect to FIG. 3, and hence is not discussed in further detail to avoid repetition.

The metallization process may be implemented by using suitable fabrication processes such as a damascene process, whereby a conductive seed layer may be deposited first, and then a conductive material such as copper and the like is filled into the opening with electro-deposition. After filling the conductive material into the trench, a CMP process may be employed to polish the surface.

Figure 9:
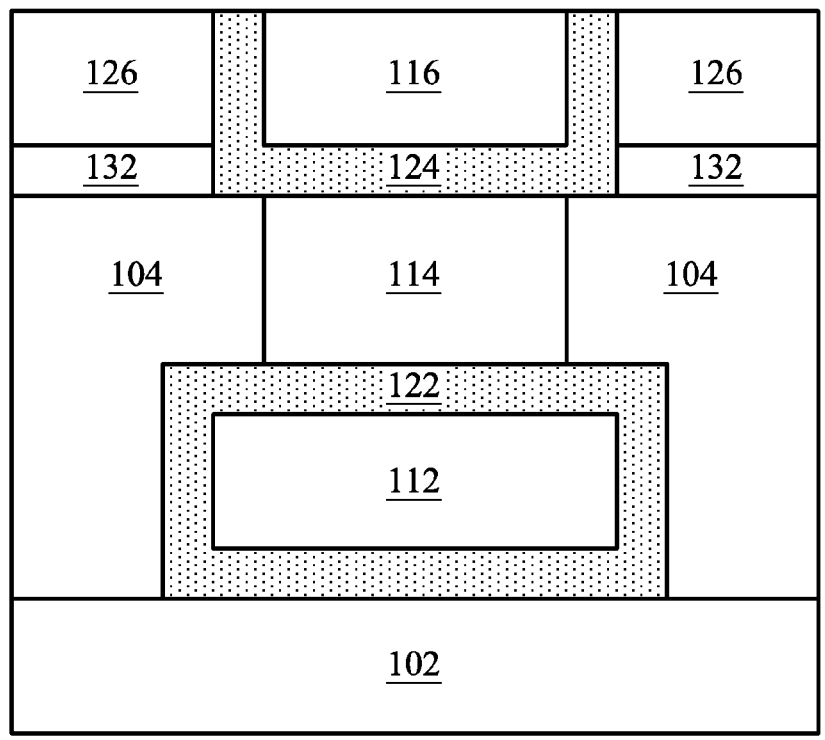
FIG. 9 illustrates a cross sectional view of a semiconductor device having a carbon nanotube interconnection structure in accordance with another embodiment.

FIG. 9 illustrates a cross sectional view of a semiconductor device having a carbon nanotube interconnection structure in accordance with an embodiment. The cross sectional view of FIG. 9 is similar to the cross sectional view of FIG. 1 except that the carbon nanotube interconnection structure 114 is not surrounded by a carbon layer. Instead, the metal lines (e.g., the first metal line 112) are surrounded by a carbon layer. In accordance with an embodiment, the metal lines (e.g., the first metal line 112 and the second metal line 116) are formed of a carbon metal alloy. Through a suitable carbon diffusion process such as a thermal process, the carbon atoms of the carbon metal alloy are in a carbon diffusion state. As a result, a thin carbon layer is formed surrounding the metal line (e.g., the first metal line 112).

Figure 10:
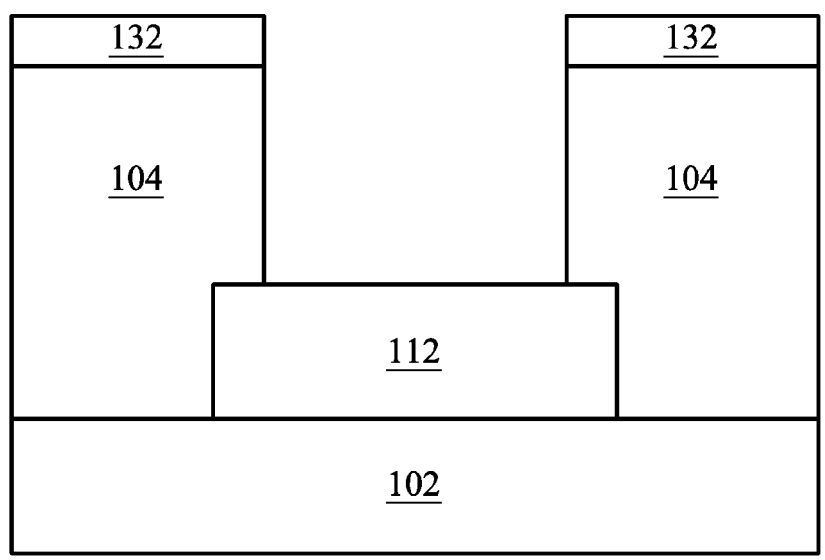
FIGS. 10-16 illustrate intermediate steps of fabricating the interconnection structure shown in FIG. 9 in accordance with an embodiment.
Figure 11:
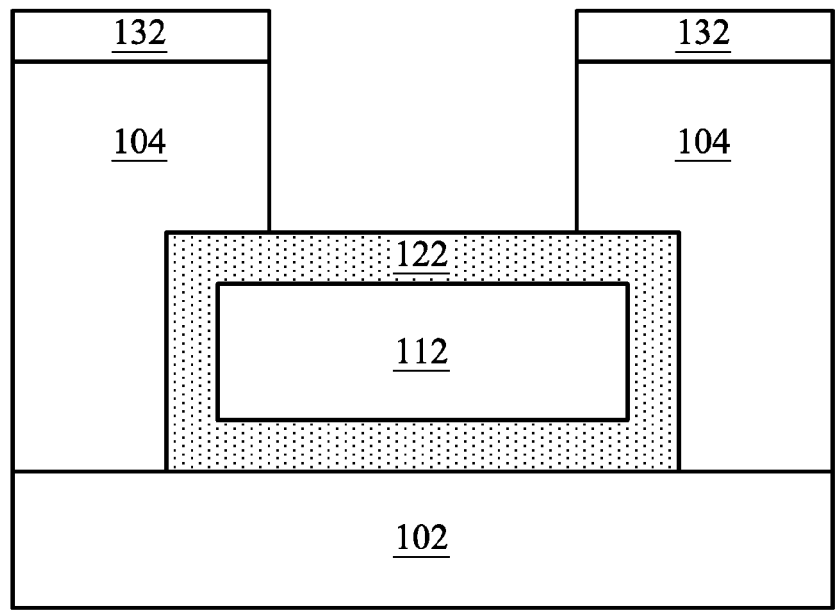
Figure 12:
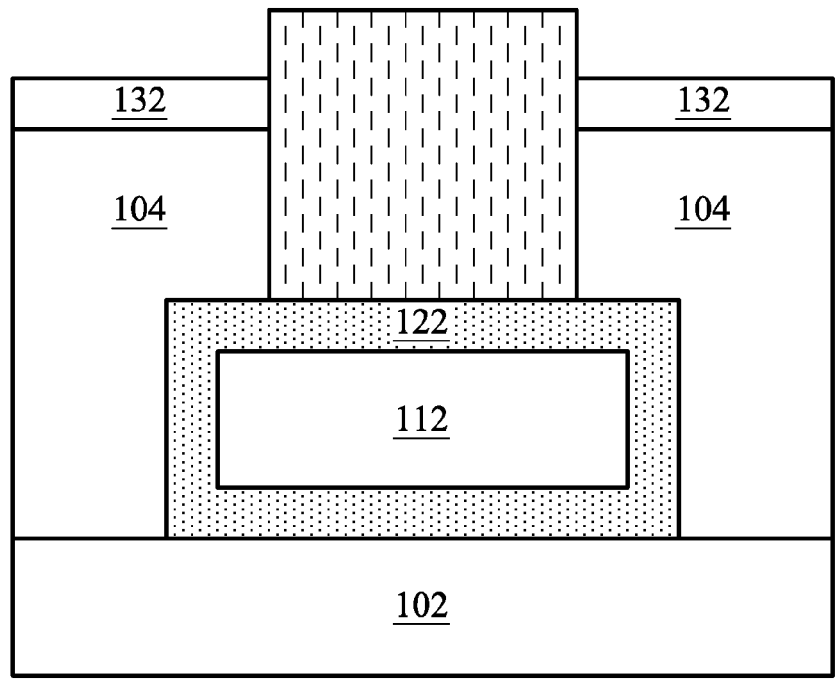
Figure 13:
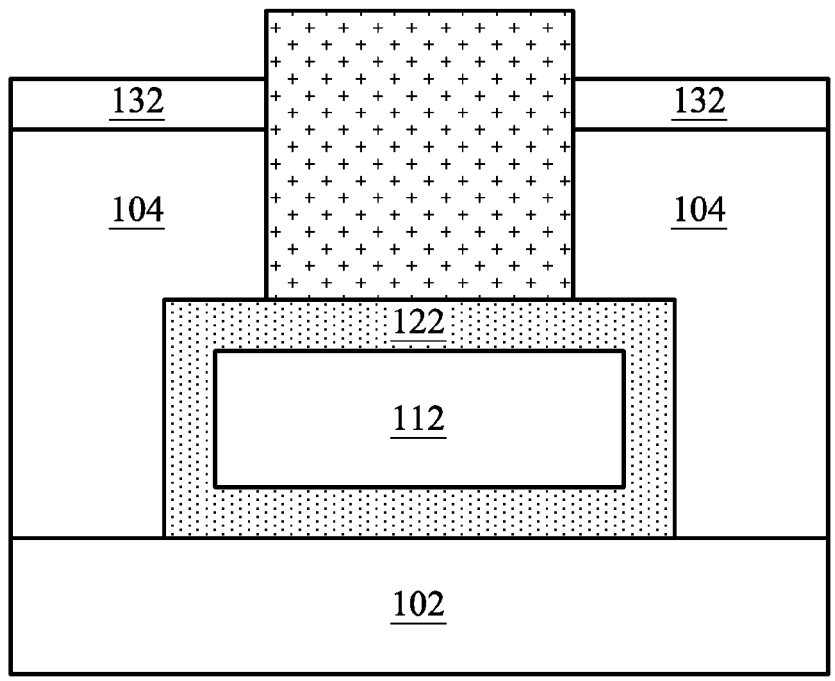
Figure 14:
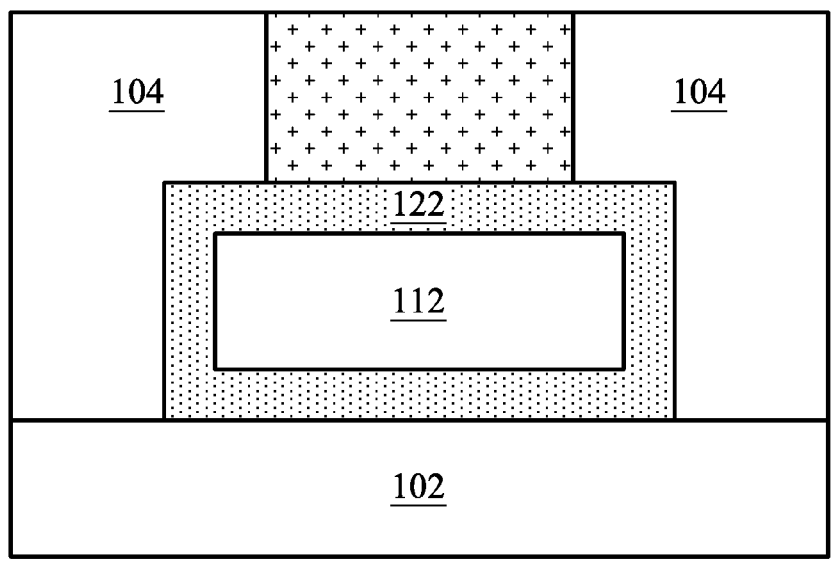
Figure 15:
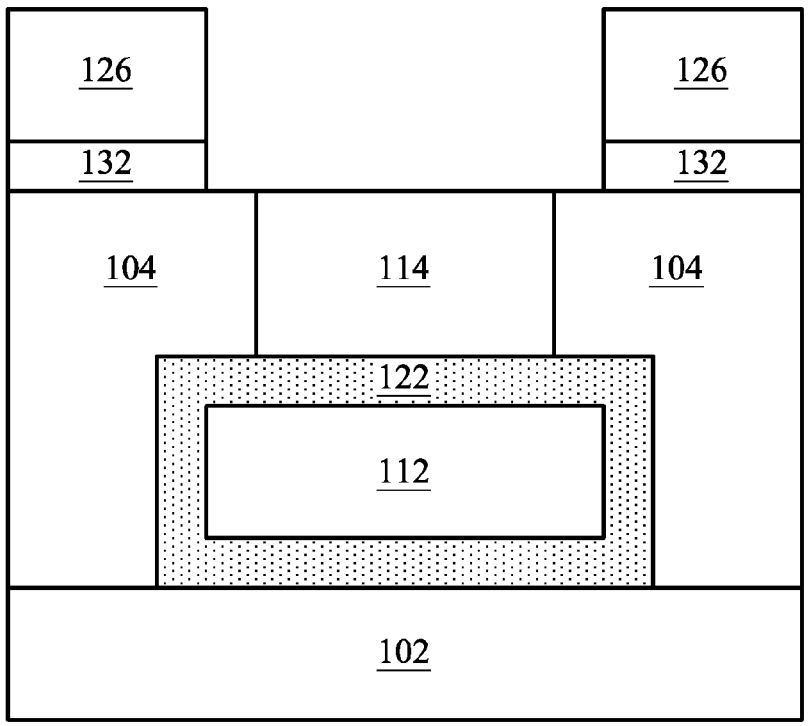
Figure 16:
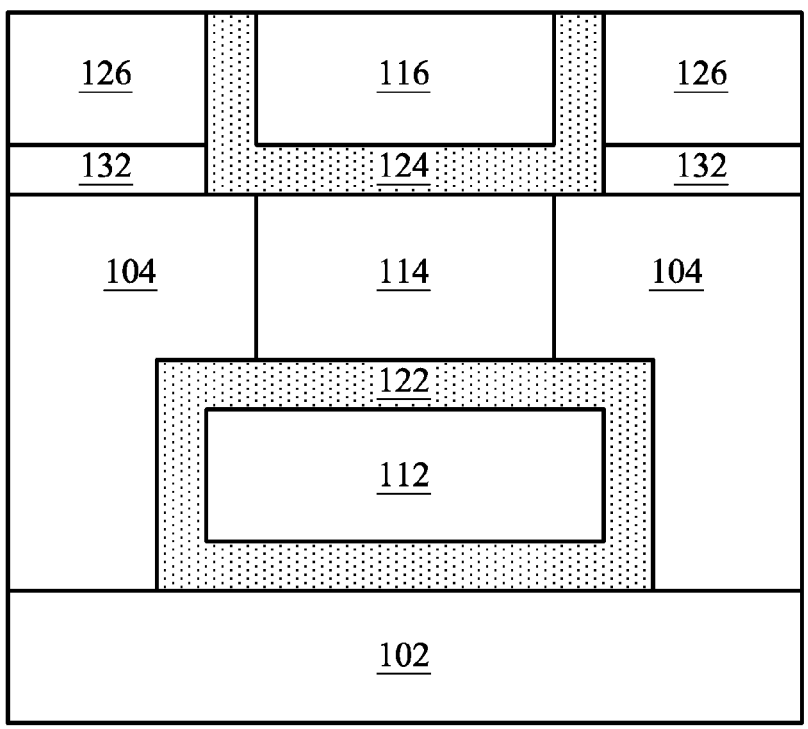

FIGS. 10-16 illustrate intermediate steps of fabricating the interconnection structure shown in FIG. 9 in accordance with an embodiment. FIGS. 10-16 are similar to FIGS. 2-8 except that a carbon deposition step is omitted. Instead, metal lines comprising a carbon metal alloy are employed to form a carbon interface layer between the metal line and the carbon nanotube structure. In particular, a thermal process is employed to allow the carbon atoms of the carbon metal alloy entering into a carbon diffusion state. As a result, a thin carbon layer is formed as shown in FIG. 11.

In accordance with an embodiment, the semiconductor device shown in FIG. 10 may be placed into a chamber, wherein the temperature rises up to 400 degrees. As a result, the carbon atoms diffuse out and form a thin carbon layer as shown in FIG. 11. In accordance with an embodiment, the thin carbon layer is of a thickness in a range from about 2 nanometers to about 5 nanometers.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
   a first metal line formed over a substrate;
   a first carbon layer formed over the first metal line;
   a carbon nanotube interconnect formed over the first carbon layer;
   a second carbon layer formed over the carbon nanotube interconnect; and
   a second metal line formed over the second carbon layer.

2. The apparatus of claim 1, further comprising:
   a first vertical carbon layer formed between a first sidewall of the carbon nanotube interconnect and a first dielectric layer formed on the substrate; and
   a second vertical carbon layer formed between a second sidewall of the carbon nanotube interconnect and the first dielectric layer.

3. The apparatus of claim 2, wherein:
the first vertical carbon layer is of a thickness in a range from 1 nanometer to 10 nanometers; and
the second vertical carbon layer is of a thickness in a range from 1 nanometer to 10 nanometers.

4. The apparatus of claim 1, further comprising:
a first carbon ring surrounding the first metal line; and
a second carbon ring surrounding the second metal line.

5. The apparatus of claim 4, wherein:
the first carbon ring is of a thickness in a range from 2 nanometers to 5 nanometers; and
the second carbon ring is of a thickness in a range from 2 nanometers to 5 nanometers.

6. The apparatus of claim 1, further comprising:
a first dielectric layer formed over the substrate, wherein the first metal line is embedded in the first dielectric layer; and
a second dielectric layer formed over the first dielectric layer, wherein the second metal line is embedded in the second dielectric layer.

7. The apparatus of claim 6, wherein:
the first dielectric layer is formed of low-k dielectric materials; and
the second dielectric layer is formed of low-k dielectric materials.

8. A device comprising:
a first dielectric layer formed over a substrate;
a first metal line embedded in the first dielectric layer;
a second dielectric layer formed over the first dielectric layer;
a second metal line embedded in the second dielectric layer;
an interconnect structure formed between the first metal line and the second metal line;
a first carbon layer formed between the first metal line and the interconnect structure; and
a second carbon layer formed between the second metal line and the interconnect structure.

9. The device of claim 8, wherein the interconnect structure comprises a plurality of carbon nanotubes.

10. The device of claim 8, wherein the interconnect structure is surrounded by a first carbon layer having a thickness in a range from about 1 nanometer to about 10 nanometers.

11. The device of claim 8, wherein the first metal line is surrounded by a second carbon layer having a thickness in a range from about 2 nanometer to about 5 nanometers.

12. The device of claim 8, wherein the second metal line is surrounded by a third carbon layer having a thickness in a range from about 2 nanometer to about 5 nanometers.

13. The device of claim 8, wherein:
the first metal line is formed of copper; and
the second metal line is formed of copper.

14. The device of claim 8, wherein:
the first dielectric layer is formed of low-k dielectric materials; and
the first dielectric layer is formed of low-k dielectric materials.

15. A method comprising:
forming a first metal line over a substrate;
depositing a first carbon layer over the first metal line;
depositing a plurality of catalytic pads on the first carbon layer;
growing a plurality of carbon nanotubes on the catalytic pads;
depositing a dielectric material to fill free space between the carbon nanotubes to form an interconnect layer;
depositing a second carbon layer over the interconnect layer; and
formed a second metal line over the second carbon layer.

16. The method of claim 15, further comprising:
depositing the first carbon layer over the first metal line using a first chemical vapor deposition process; and
depositing the second carbon layer over the second metal line using a second chemical vapor deposition process.

17. The method of claim 15, further comprising:
applying a chemical mechanical polish process to polish a surface of the interconnect layer after the step of depositing a dielectric material to fill free space between the carbon nanotubes to form an interconnect layer.

18. The method of claim 15, further comprising:
forming a first dielectric layer over the substrate, wherein the first metal line is embedded in the first dielectric layer; and
forming a second dielectric layer over the first dielectric layer, wherein the second metal line is embedded in the second dielectric layer.

19. The method of claim 15, further comprising:
forming the first metal line using a first carbon metal alloy; and
applying a first thermal process to the first metal line to form a first natural carbon layer surrounding the first metal line.

20. The method of claim 15, further comprising:
forming the second metal line using a second carbon metal alloy; and
applying a second thermal process to the second metal line to form a second natural carbon layer surrounding the second metal line.

* * * * *